United States Patent
Watanabe

(10) Patent No.: US 11,564,308 B2
(45) Date of Patent: Jan. 24, 2023

(54) LAMINATED CIRCUIT BOARD DEVICE

(71) Applicant: Yazaki Corporation, Tokyo (JP)

(72) Inventor: Tsunehiro Watanabe, Makinohara (JP)

(73) Assignee: YAZAKI CORPORATION, Tokyo (JP)

(*) Notice: Subject to any disclaimer, the term of this patent is extended or adjusted under 35 U.S.C. 154(b) by 0 days.

(21) Appl. No.: 17/486,142

(22) Filed: Sep. 27, 2021

(65) Prior Publication Data

US 2022/0104341 A1 Mar. 31, 2022

(30) Foreign Application Priority Data

Sep. 28, 2020 (JP) .............................. JP2020-162414

(51) Int. Cl.
*H05K 1/02* (2006.01)

(52) U.S. Cl.
CPC ..... *H05K 1/0224* (2013.01); *H05K 2201/0355* (2013.01)

(58) Field of Classification Search
CPC .. H05K 1/0218; H05K 1/0224; H05K 1/0225; H05K 1/0227; H05K 1/0253
See application file for complete search history.

(56) References Cited

U.S. PATENT DOCUMENTS

| 6,657,130 B2 * | 12/2003 | Van Dyke ......... H01L 23/49838 257/E23.079 |
| 2004/0211591 A1 | 10/2004 | Kumakura et al. |
| 2020/0170113 A1 | 5/2020 | Sreerama et al. |

FOREIGN PATENT DOCUMENTS

| JP | 11220056 A | 8/1999 |
| JP | 2016092864 A | 5/2016 |

* cited by examiner

*Primary Examiner* — Jeremy C Norris
(74) *Attorney, Agent, or Firm* — Sughrue Mion, PLLC

(57) ABSTRACT

A circuit pattern of a power line and a circuit pattern of a signal line are disposed in a first layer of a laminated circuit board device, a circuit pattern of the signal line to be protected is disposed in a second layer, and a circuit pattern of a power line is disposed in a third layer. The shapes of the first circuit pattern of the power line of the first layer and the second circuit pattern of the power line of the third layer are substantially matched with each other with respect to a portion of the second layer facing the circuit pattern of the signal line. The direction of the current of the first circuit pattern coincides with the direction of the current of the second circuit pattern.

6 Claims, 5 Drawing Sheets

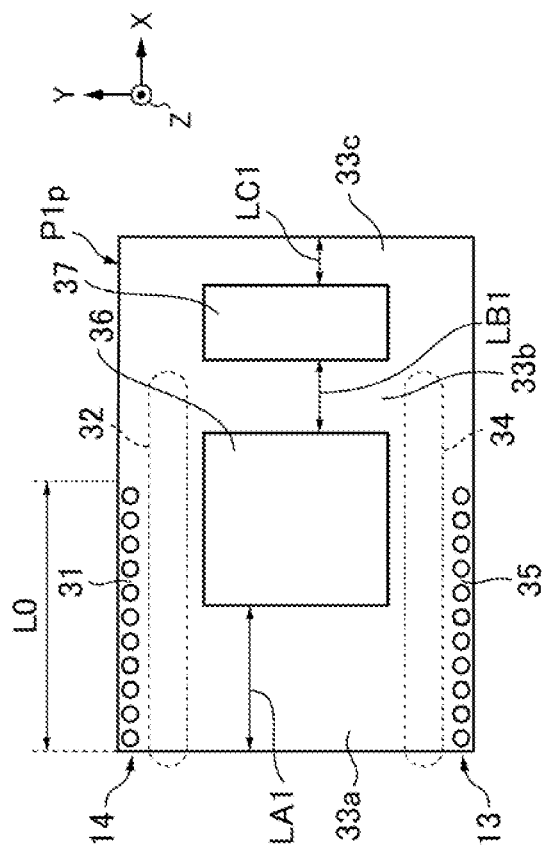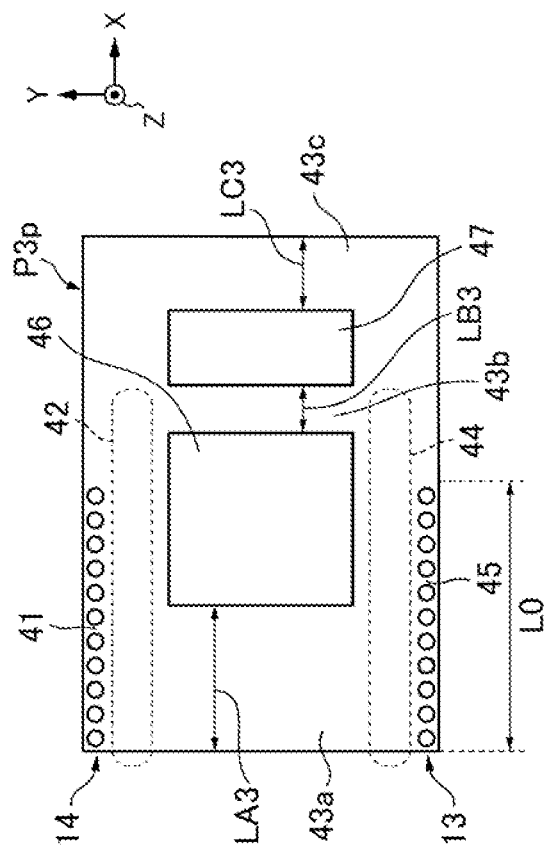

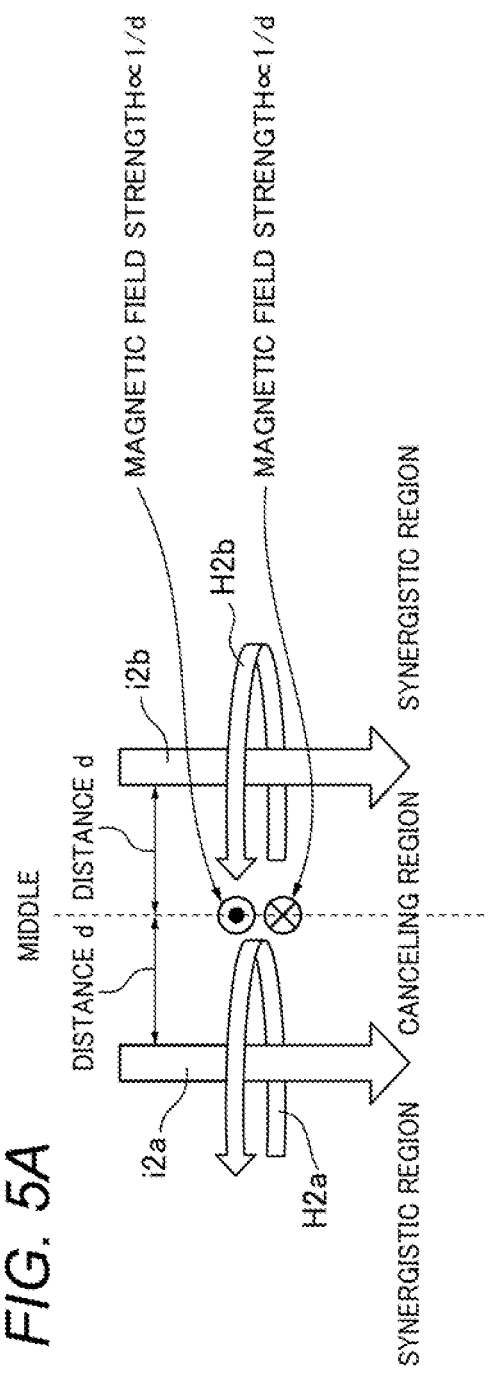

LAMINATED CIRCUIT BOARD DEVICE

CROSS REFERENCE TO RELATED APPLICATIONS

This application is based on and claims priority from Japanese patent application No. 2020-162414 filed on Sep. 28, 2020, the entire contents of which are incorporated herein by reference.

TECHNICAL FIELD

The present invention relates to a laminated circuit board device including laminated circuit patterns of a plurality of layers.

BACKGROUND ART

In various electronic circuits such as an in-vehicle device, a malfunction may occur or the performance of the device may decrease due to an influence of noise generated from other devices, wiring, or the like existing at an adjacent position. Therefore, various kinds of noise countermeasures have been taken at the time of designing the device and the time of disposing the device.

For example, Patent Literature JP-A-11-220056 discloses a technique for reducing an inductance of a wiring or a wiring lead in a semiconductor package disposed on a general wiring board and reducing an inductive crosstalk. Specifically, a predetermined wiring is disposed on an insulating board, and an electromagnetic wave shielding film (metal foil) is disposed at a position close to the wiring. In addition, an electromagnetic wave shielding film is disposed on a surface of a semiconductor chip on which an integrated circuit is formed with an insulating film interposed therebetween, a lead is disposed on the electromagnetic wave shielding film with an insulating film interposed therebetween, and the lead and an external terminal of the semiconductor chip are electrically connected to each other, and sealed with a sealing material to form a semiconductor device.

In addition, Patent Literature JP-A-2016-92864 discloses a technique for reducing noise of an electric power conversion device. Specifically, the electric power conversion device includes a multilayer board in an output wiring portion that outputs the converted electric power. A multilayer board, a ground layer, and output wiring layers (U, V, W) are provided, and vias are provided between the output wiring layers. The output wiring layer is a flat plate, and the output wiring layers are arranged side by side with a wide area facing the ground layer. A plurality of vias are formed between the output wiring layers and penetrate from the ground layer to the surface of the multilayer board. A conductive sheet is provided on an end portion of a via (ground potential) exposed on the surface of the multilayer board.

Incidentally, for example, in the case of electronic devices such as DC/DC converters mounted on vehicles or switching devices for switching electric power paths, a power system line (power line) that handles a large current and a signal system line (signal line) through which only various signals having a very small amount of current pass are disposed in a mixed state on the same printed board. That is, the power line and the various signal line are disposed at positions adjacent to each other.

In addition, since the wiring pattern on the printed board is generally formed of a very thin foil-like conductor, it is important to reduce the power loss due to the resistance of the wiring pattern of the power line on the board when a large current flows. Therefore, in a normal design, the resistance is reduced by sufficiently increasing the line width and the area of the wiring pattern with respect to the power line and the ground line (earth).

In addition, when a multilayer board can be used, a wiring pattern of a power line may be formed on each of a plurality of layers on the same board. For example, when the wiring patterns of the two layers are connected in parallel, the resistance value per unit area of the wiring pattern can be reduced to half, it becomes easy to suppress the increase in the area of the wiring pattern of the power line and reduce the area occupied by the board of the electronic device.

However, in a case where a power line and a signal line exist in a plurality of layers adjacent to each other in the thickness direction of the same board, there is a concern that the influence of noise appears on the signal line since the distance between the wiring patterns of the power line and the signal line facing each other becomes very small. Specifically, the noise waveform is superimposed on the wiring pattern of the adjacent signal line due to the counter electromotive force of the induction magnetic field generated when the current on the power line changes.

In particular, in the case of an electronic device such as a DC/DC converter, since switching of a large current is periodically performed at high speed, there is a concern that large noise may be induced in a signal line adjacent to a power line through which the current flows in synchronization with a timing of a current change in switching.

As a countermeasure against such noise, it is assumed that a wiring pattern of a ground line is disposed between a noise generation source and a signal line, and an electromagnetic shield is provided as a general design method.

For example, as in the configuration example illustrated in FIG. 7, in the case of using a multilayer board in which a conductive pattern is formed in each of a first layer, a second layer, and a third layer, a power line is disposed in the first layer, a signal line to be protected is disposed in the third layer, and a wiring pattern of the ground line is allocated to the second layer between the first layer and the third layer. Accordingly, since a ground line having a constant potential exists in the second layer between the power line of the first layer, which is the noise source, and the third layer in which the signal line exists, it is possible to block the induction magnetic field and suppress the induction of noise in the signal line of the third layer.

However, in the case of the configuration as described above, the second layer in the middle of the three layers is occupied only by the ground line of the noise countermeasure, and the power line can be disposed only on the first layer. That is, since the power line, which is the source of noise, cannot be disposed in the third layer, the power line cannot be distributed in a plurality of layers and disposed in each layer. Therefore, the resistance cannot be reduced as long as the wiring pattern area of the power line is not increased.

SUMMARY OF INVENTION

The present invention has been made in view of the above-described circumstances, and an object of the present invention is to provide a laminated circuit board device capable of suppressing an influence of an induction magnetic field generated according to the current change of a power line on a signal line of the other adjacent layer without using a dedicated ground layer for noise shielding.

According to the embodiment, in the laminated circuit board device, circuit patterns of a first layer, a second layer, and a third layer are formed on different surfaces parallel to each other by a foil-like conductor, the first layer, the second layer, and the third layer are separated by an insulator, and the second layer is disposed between the first layer and the third layer.

The circuit pattern includes a circuit pattern of an electric power system for passing a current flowing between a predetermined power source and a predetermined load, and a circuit pattern of a signal system through which a current smaller than that of the power system passes, the circuit pattern of the electric power system and the circuit pattern of the signal system are disposed in the first layer, respectively, the circuit pattern of the signal system is disposed in the second layer, and the circuit pattern of the electric power system is disposed in the third layer, the circuit pattern is formed such that shapes of a first circuit pattern belonging to the electric power system of the first layer and a second circuit pattern belonging to the electric power system of the third layer substantially coincide with each other, for a facing portion facing a protection portion of at least a part of the circuit pattern of the signal system in the second layer, the specification is defined such that a direction of the current flowing through the first circuit pattern and a direction of the current flowing through the second circuit pattern coincide with each other.

BRIEF DESCRIPTION OF DRAWINGS

FIG. 4A and FIG. 4B are plan views illustrating an example of wiring patterns in a first layer and a third layer, respectively.

FIG. 5A and FIG. 5B are schematic diagrams illustrating a relationship between a direction of two currents at positions adjacent to each other and an influence of an induction magnetic field.

DESCRIPTION OF EMBODIMENTS

A specific embodiment according to the present invention will be described below with reference to the drawings.

<Configuration of Laminated Circuit Board Device>

Figure 1:
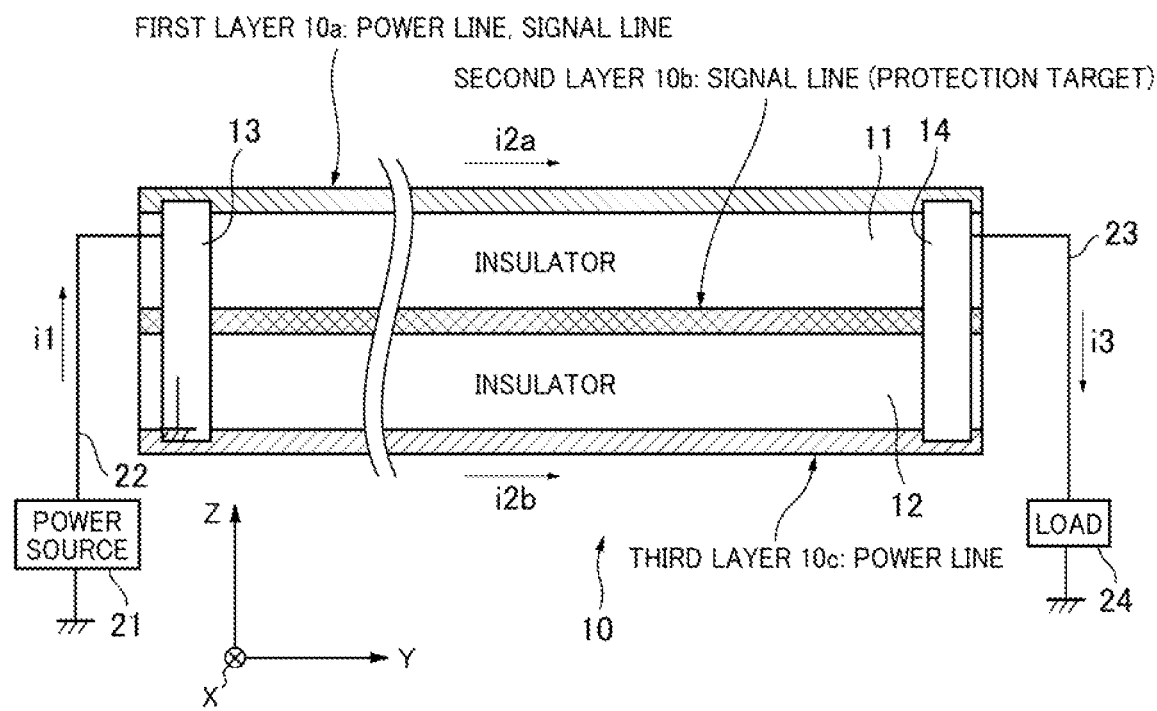
FIG. 1 is a longitudinal cross-sectional view illustrating a configuration of a laminated circuit board device according to an embodiment of the present invention.
Figure 2:
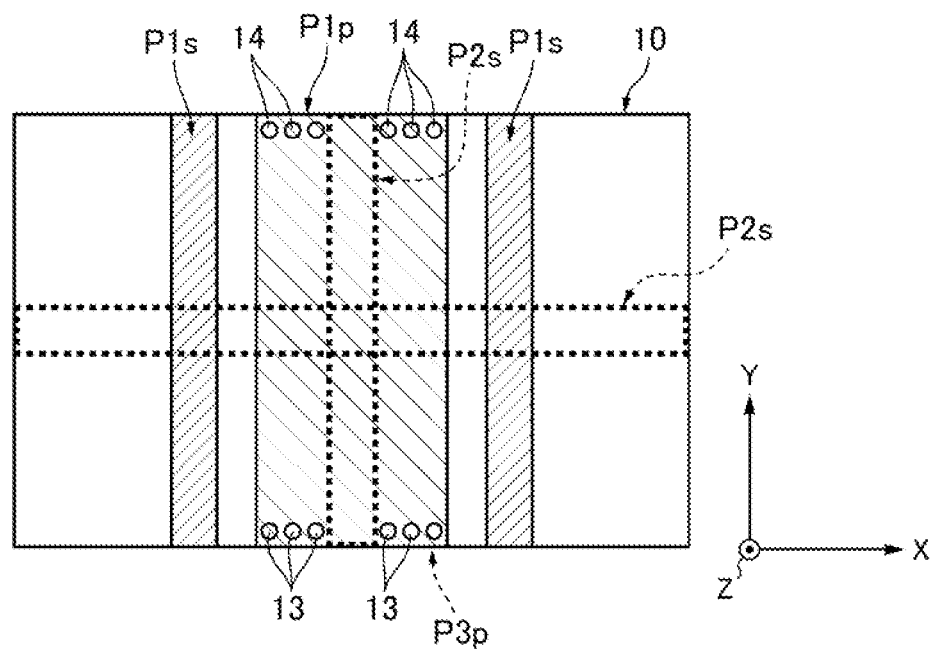
FIG. 2 is a plan view illustrating an example of a wiring pattern of each layer of the laminated circuit board device.
Figure 3A:
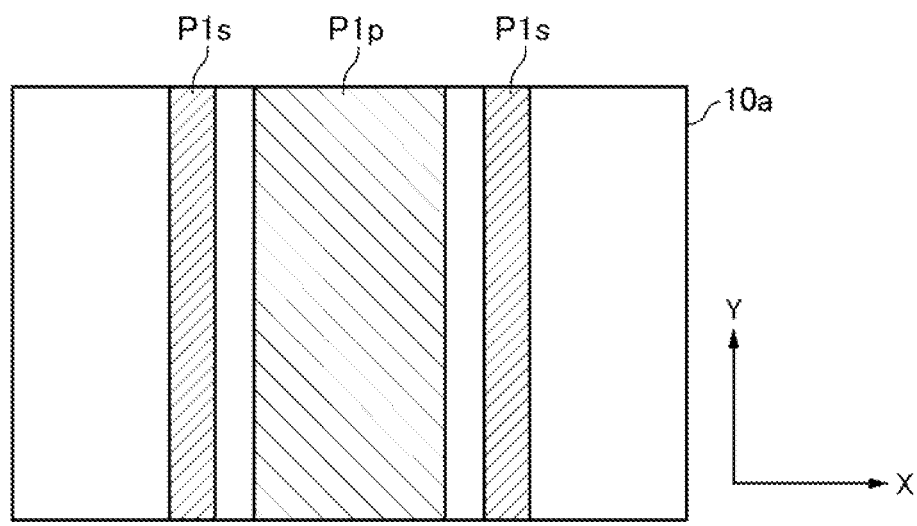
FIG. 3A, FIG. 3B, and FIG. 3C are plan views illustrating an example of wiring patterns in a first layer, a second layer, and a third layer, respectively.
Figure 3B:
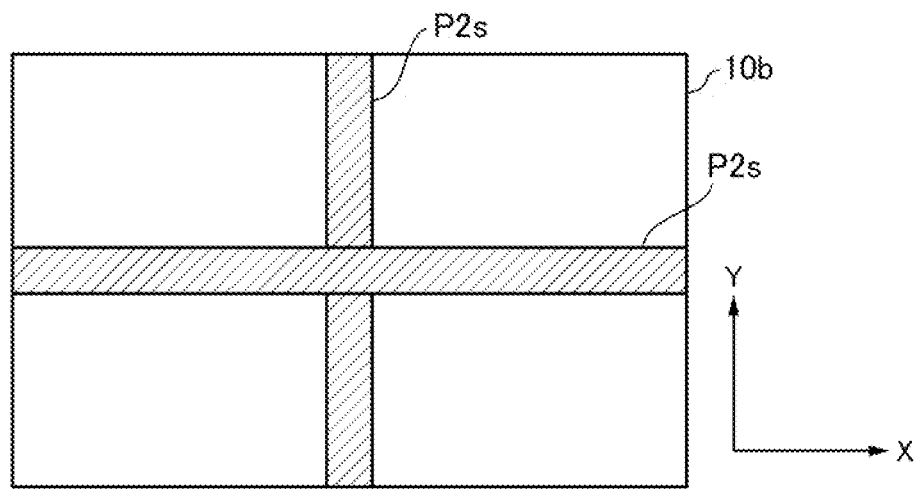
Figure 3C:
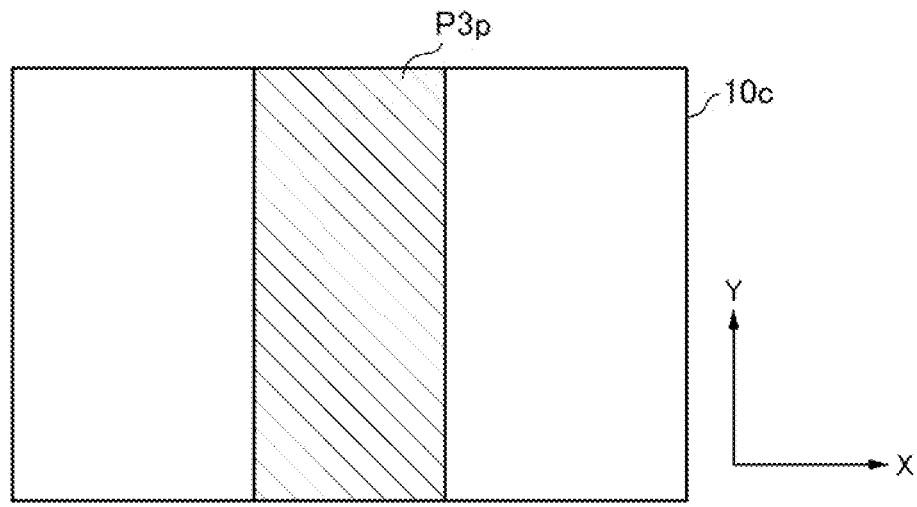

FIG. 1 is a longitudinal cross-sectional view illustrating a configuration of a laminated circuit board device 10 according to an embodiment of the present invention. FIG. 2 is a plan view of a wiring pattern of each layer in the laminated circuit board device 10. In addition, FIGS. 3A, 3B, and 3C are plan views illustrating examples of wiring patterns in the first layer, the second layer, and the third layer, respectively.

As illustrated in FIG. 1, the laminated circuit board device 10 includes a three-layer multilayer board having a first layer 10a, a second layer 10b, and a third layer 10c. The first layer 10a, the second layer 10b, and the third layer 10c are formed of a conductor such as a copper foil having a constant thickness attached to the surface of the board composed of insulators 11, 12. That is, the multilayer board is a printed circuit board having a three-layer structure.

Therefore, each of the first layer 10a, the second layer 10b, and the third layer 10c is a conductive layer having a uniform thickness. Actually, of the conductors formed on the entire surface of the board, the insulators 11, 12 are exposed to the surface except for the wiring pattern of the portion forming the necessary circuit. Therefore, the plurality of independent wiring patterns can be electrically separated by the insulators 11, 12.

In the laminated circuit board device 10 illustrated in FIG. 1, each wiring pattern of the power line and the signal line is formed in the first layer 10a, the wiring pattern of the signal line to be protected is formed in the second layer 10b, and the wiring pattern of the power line is formed in the third layer 10c.

The wiring pattern of the power line is used, for example, to connect a circuit of an electric power system through which a large current of about several amperes to several tens amperes flows. In addition, the wiring pattern of the signal line is used, for example, in order to connect a circuit of a signal system in which only a very small current of about several milliamperes flows.

In the signal system, for example, there is a circuit that is likely to be affected by noise coming from the outside, such as when the impedance of the circuit is high or when a weak signal is handled. In such a circuit of the signal line, it is necessary to reduce and protect the influence of noise as much as possible. A wiring pattern of such a circuit is disposed in the second layer 10b.

In addition, since the wiring pattern of the power line needs to flow a very large current, when a wiring pattern of a thin conductive layer such as a copper foil is used, when the pattern width in the width direction orthogonal to the direction in which the current passes is not widened, the resistance value increases and the power loss increases. On the other hand, in an application in which the ON/OFF of the current of the power line is periodically switched, noise is generated in the surrounding wiring pattern due to the counter electromotive force of the induction magnetic field generated when the current greatly changes.

Therefore, the wiring pattern of the signal line to be protected needs to be protected from the noise of the induction magnetic field generated from the wiring pattern in the vicinity of the power line. Therefore, in the laminated circuit board device 10 illustrated in FIG. 1, the wiring pattern of the power line is disposed in both the first layer 10a and the third layer 10c, and the wiring pattern of the signal line to be protected is disposed in the second layer 10b located in the middle of the first layer 10a and the third layer 10c. That is, in the thickness direction (Z-axis direction) of the laminated circuit board device 10, the distance from the wiring pattern of the second layer 10b to the first layer 10a is equal to the distance from the wiring pattern of the second layer 10b to the third layer 10c.

Further, the wiring pattern of the power line in the first layer 10a and the wiring pattern of the power line in the third layer 10c are configured to have the same pattern shape at least in the portion facing the wiring pattern of the second layer 10b. In addition, the specifications of the laminated circuit board device 10 are determined such that the direction of the current i2a flowing through the power line of the first layer 10a and the direction of the current i2b flowing through the power line of the third layer 10c are aligned.

On the other hand, vias 13, 14 that penetrate the multi-layer board in the thickness direction are formed on one end side and the other end side in the wiring pattern formation portion of the power line on the laminated circuit board device 10. The via 13 electrically and commonly connects the power line of the first layer 10a and the power line of the third layer 10c on one end side. In addition, the via 14 electrically and commonly connects the power line of the first layer 10a and the power line of the third layer 10c on the other end side.

In the example illustrated in FIG. 1, a power source 21 is electrically connected to the via 13 of the laminated circuit board device 10 via the electric wire 22. In addition, the load 24 is connected to the via 14 of the laminated circuit board device 10 via the electric wire 23.

Therefore, in the example illustrated in FIG. 1, the current i1 supplied from the power source 21 passes through the electric wire 22, is divided into the currents i2a and i2b of two systems by the via 13, the current i2a passes through the wiring pattern of the power line of the first layer 10a, the current i2b passes through the wiring pattern of the power line of the third layer 10c, respectively, and the current i3 which is joined by the via 14 is supplied to the load 24 through the electric wire 23.

Here, by equalizing the shape of the wiring pattern of the power line of the first layer 10a and the shape of the wiring pattern of the power line of the third layer 10c, the current i1 can be divided into two, the current values and current distributions of the currents i2a and i2b of two systems can be made common. As a result, the induction magnetic field generated according to the change in the current i2a and the induction magnetic field generated according to the change in the current i2b can be equalized.

In addition, at the position of the wiring pattern of the second layer 10b disposed in the middle of the first layer 10a and the third layer 10c, the influence of the induction magnetic field generated with the change in the current i2a and the influence of the induction magnetic field generated with the change in the current i2b are opposite to each other, thus, the influences will be offset with each other. That is, in the wiring pattern of the signal line to be protected disposed in the second layer 10b, the influence of the induction magnetic field generated from the power line (the first layer 10a+the third layer 10c) existing in the vicinity thereof is eliminated, and the generation of noise is suppressed.

As illustrated in FIGS. 2 and 3A, a power system wiring pattern P1p having a relatively large area and a plurality of signal system wiring patterns P1s are formed in the first layer 10a. In this example, since current flows in the Y-axis direction in FIG. 3A, an electric power system wiring pattern P1p is formed such that the width in the X-axis direction is sufficiently large. Accordingly, the electric resistance of the electric power system wiring pattern P1p can be reduced. The pattern width of the electric power system wiring pattern P1p is uniformly formed from one end to the other end in the Y-axis direction.

The plurality of signal system wiring patterns P1s on the first layer 10a are each disposed at a position slightly separated from the electric power system wiring pattern P1p. Therefore, the signal system wiring pattern Pls and the electric power system wiring pattern P1p are electrically insulated from each other by the insulator 11. Since a relatively small current flows through each of the signal system wiring patterns P1s, these pattern widths do not need to be as large as the electric power system wiring pattern P1p. Incidentally, in the configuration example of FIG. 1, each of the signal system wiring patterns P1s of the first layer 10a is not a protection target with respect to the induction magnetic field.

As illustrated in FIGS. 2 and 3B, signal system wiring patterns P2s to be protected are formed in the second layer 10b. That is, the wiring pattern of the electric power system as a source of noise does not exist on the second layer 10b. In the signal system wiring patterns P2s of the second layer 10b illustrated in FIGS. 2 and 3B, a portion facing the electric power system wiring pattern P1p existing at a position adjacent to the thickness direction is included. That is, the portion of the signal system wiring pattern P2s may be affected by the induction magnetic field generated by the current change of the electric power system wiring pattern P1p adjacent to the signal system wiring pattern P2s at a short distance.

As illustrated in FIGS. 2 and 3C, only the electric power system wiring pattern P3p is formed in the third layer 10c. The pattern shape of the electric power system wiring pattern P3p of the third layer 10c is the same as that of the electric power system wiring pattern P1p of the first layer 10a. That is, the pattern width, the area, and the shape of the electric power system wiring pattern P3p are common to those of the electric power system wiring pattern P1p. In addition, the positions at which the power system wiring patterns P3p are formed such that the surfaces of the two electric power system wiring patterns P1p, P3p face each other are disposed according to the positions of the electric power system wiring patterns P1p in the X and Y directions.

Therefore, in the region on the signal system wiring pattern P2s, the positional relationship is adjusted such that the portion facing the electric power system wiring pattern P1p of the first layer 10a also faces the electric power system wiring pattern P3p of the third layer 10c in the same manner.

Accordingly, the influence of the induction magnetic field generated by the current change of the electric power system wiring pattern P1p of the first layer 10a and the influence of the induction magnetic field generated by the current change of the electric power system wiring pattern P3p of the third layer 10c can be canceled out at the position of the signal system wiring pattern P2s of the second layer 10b in the middle thereof. However, it is necessary to align the directions of the currents i2a, i2b and match the magnitude and the distribution state of these currents.

<Specific Example of Wiring Pattern>

FIGS. 4A and 4B are plan views illustrating a configuration example of the wiring pattern of the power line in the first layer 10a and the third layer 10c of the laminated circuit board device 10.

In the example of FIG. 4A, the portion corresponding to the electric power system wiring pattern P1p illustrated in FIG. 3 includes the one end side sharing portion 31, a branching/merging portion 32, individual patterns 33a, 33b, and 33c, a branching/merging portion 34, and the other end side sharing portion 35.

The current path of the one end side sharing portion 31 is branched in three directions by the branching/merging portion 32, and is connected to the individual patterns 33a, 33b, and 33c. In addition, the three current paths of the individual patterns 33a, 33b, and 33c merge at the branching/merging portion 34 and are connected to the other end side sharing portion 35.

Incidentally, a space portion 36 formed between the individual patterns 33a, 33b and a space portion 37 formed between the individual patterns 33b, 33c can be used, for example, to dispose the signal system wiring pattern PIs or to dispose a necessary electronic component.

As described above, in the example of FIG. 4B, the portion corresponding to the electric power system wiring pattern P3p illustrated in FIG. 3C includes the one end side sharing portion 41, a branching/merging portion 42, individual patterns 43a, 43b, and 43c, a branching/merging portion 44, and the other end side sharing portion 45.

That is, the current path of the one end side sharing portion 41 is branched in three directions by the branching/merging portion 42, and is connected to the individual patterns 43a, 43b, and 43c. The three current paths of the individual patterns 43a, 43b, and 43c merge at the branching/merging portion 44 and are connected to the other end side sharing portion 45.

Here, the electric power system wiring pattern P1p having the configuration illustrated in FIG. 4A and the electric power system wiring pattern P3p illustrated in FIG. 4B have shapes similar to each other as a whole, but are partially different. That is, on the one end side where the via 14 exists and on the other end side where the via 13 exists, the pattern width (width in the direction orthogonal to the direction of the current) L0 of the via portion is common (same) to the electric power system wiring patterns P1p, P3p of two layers, and the pattern width LA1 of the individual pattern 33a and the pattern width LA3 of the individual pattern 43a are also common (same). On the other hand, the pattern width LB1 and the pattern width LB3 are different from each other, and the pattern width LC1 and the pattern width LC3 are different from each other.

In the present embodiment, when the pattern width L0 is expressed as 100%, the pattern widths LA1, LB1, and LC1 are 50%, 30%, and 20%, respectively, and the pattern widths LA3, LB3, and LC3 are determined to be 50%, 20%, and 30%, respectively.

Therefore, the total pattern width (LA1+LB1+LC1: 100%) in the portions of the individual patterns 33a, 33b, and 33c is the same as the pattern width L0 (100%) in each portion of the one end side sharing portion 31 and the other end side sharing portion 35. In addition, the total pattern width (LA3+LB3+LC3: 100%) in the portions of the individual patterns 43a, 43b, and 43c is the same as the pattern width L0 (100%) in each portion of the one end side sharing portion 41 and the other end side sharing portion 45.

Therefore, the current density per unit dimension in the width direction (X) in the first layer 10a is uniform at each portion of the one end side sharing portion 31, the other end side sharing portion 35, and the individual patterns 33a, 33b, and 33c. Similarly, in the third layer 10c, the current density per unit dimension in the width direction (X) is uniform at each portion of the one end side sharing portion 41, the other end side sharing portion 45, and the individual patterns 43a, 43b, and 43c. In addition, by equalizing the currents i2a and i2b of the two layers, the current density of the power line of the first layer 10a is the same as the current density of the power line of the third layer 10c.

In addition, the individual patterns 33a of the first layer 10a and the individual patterns 43a of the third layer 10c are disposed in a state of being aligned in the plane of each layer so as to face each other with the second layer 10b interposed therebetween. In addition, the individual pattern 33a and the individual pattern 43a have the same shape.

Therefore, as in the case of the laminated circuit board device 10 illustrated in FIGS. 1 to 3C, in the region sandwiched between the individual pattern 33a of the first layer 11a and the individual pattern 43a of the third layer 10c among the signal system wiring patterns P2s to be protected disposed in the second layer 10b, the induction magnetic field received from the individual pattern 33a and the induction magnetic field received from the individual pattern 43a have the same magnitude. Since the directions of the influence are opposite to each other, the induction magnetic field received from the individual pattern 33a and the induction magnetic field received from the individual pattern 43a cancel each other out.

That is, when the signal system wiring pattern P2s to be protected from the influence of the induction magnetic field is disposed on the second layer 10b of the portion facing the individual patterns 33a, 43a having the same shape, it is possible to suppress the generation of noise. In addition, the electric power system wiring patterns P1p, P3p through which a large current flows and the signal system wiring pattern P2s which handles a weak current can be disposed on the same board.

Incidentally, since the pattern widths LB1 and LB3 are different from each other, and the pattern widths LC1 and LC3 are different from each other, on the second layer 10b, an influence of an induction magnetic field is generated in a portion facing the individual pattern 33b of the first layer 10a and the individual pattern 43b of the third layer 10c, a portion facing the individual pattern 33c of the first layer 10a and the individual pattern 43c of the third layer 10c. However, it is possible to avoid the occurrence of a problem by disposing a circuit or an electronic component that is less likely to be affected by the induction magnetic field in that portion.

<Relationship Between Direction of Current and Influence of Inductive Magnetic Field>

FIG. 5A and FIG. 5B are schematic diagrams illustrating the relationship between the direction of two currents at positions adjacent to each other and the influence of the induction magnetic field.

FIG. 5A illustrates a relationship between currents i2a, i2b flowing parallel to each other in the same direction and induction magnetic fields H2a, H2b generated due to these changes. That is, a situation corresponding to the induction magnetic field by the currents i2a, i2b flowing through the power lines of the first layer 10a and the third layer 10c illustrated in FIG. 1 is illustrated.

As illustrated in FIG. 5A, at the intermediate position separated by the distance d from the positions of the currents i2a, i2b, the magnetic field strength is inversely proportional to the distance d. In addition, the direction of the induction magnetic field H2a and the direction of the induction magnetic field H2b are opposite to each other, these effects cancel each other out. That is, in the case where the change in the current i2a and the change in the current i2b are the same as in the laminated circuit board device 10, the influence of the synthesized induction magnetic fields H2a, H2b becomes zero at the portion of the signal line of the second layer 10b which is the intermediate position therebetween. Therefore, it is possible to suppress noise that influences the signal system wiring pattern P2s of the second layer 10b.

In the situation of FIG. 5A, the induction magnetic fields H2a, H2b become canceling regions that cancel each other out. In addition, since the two induction magnetic fields H2a, H2b are added to the portion outside the position of the current i2a and the portion outside the position of the current i2b with respect to the intermediate position, the influence is larger than in the case of only one of them is used. That is, this is a synergistic area.

On the other hand, FIG. 5B illustrates a relationship between currents i2a, i2b flowing parallel to each other in directions opposite to each other and induction magnetic fields H2a, H2b generated due to these changes. This corresponds to, for example, the relationship between the current flowing through the two differential signal lines and the induction magnetic field generated by the current.

As illustrated in FIG. 5B, at the intermediate position separated by the distance d from the positions of the currents i2a, i2b, the direction of the induction magnetic field H2a is the same as the direction of the induction magnetic field H2b, thus, these influences are added to each other. That is, since the range between the position of the current i2a and the position of the current i2b becomes a synergistic region, even when the differential signal line is employed, the noise in this range cannot be reduced.

On the other hand, in the state of FIG. 5B, outside the current i2b, the magnetic field strength due to the current i2a is inversely proportional to (r+d), the magnetic field strength due to the current i2b is inversely proportional to (r−d), and the directions of the induction magnetic fields H2a, H2b are opposite to each other. Therefore, at a distant position separated by a very large distance r (r>>d) from the intermediate position, the influence of the induction magnetic fields H2a, H2b becomes almost the same, and the induction magnetic fields H2a. H2b cancel each other out.

That is, in the example of FIG. 5B, the outside of each position of the currents i2a, i2b becomes a canceling region, and noise can be reduced within that range. However, noise increases in the range on the inner side of each position of the currents i2a, i2b.

<Examples of Waveforms>

Figure 6:
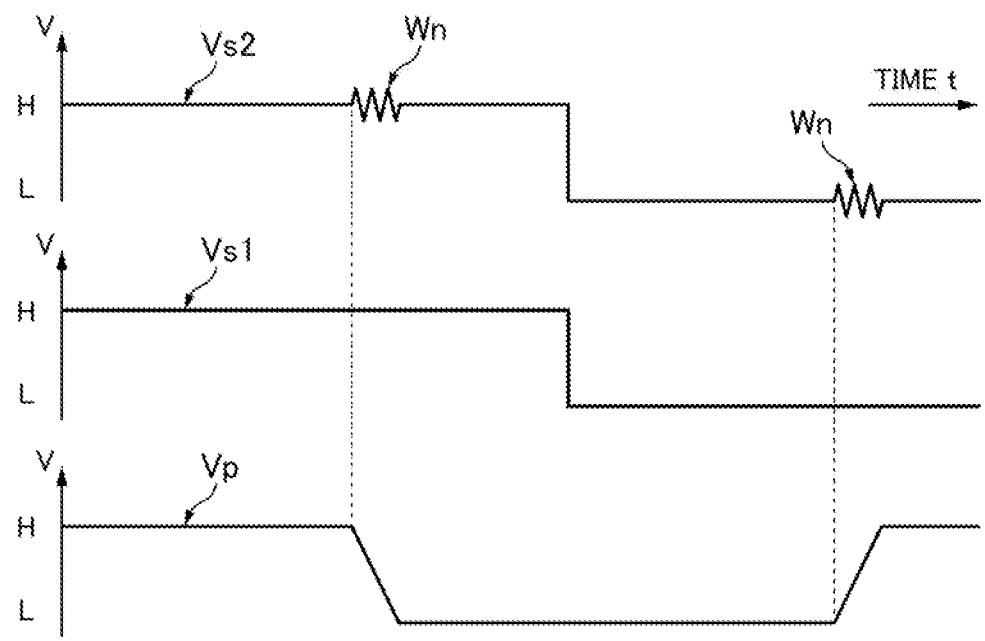
FIG. 6 is a time chart illustrating an example of a voltage waveform and a noise waveform.
Figure 7:
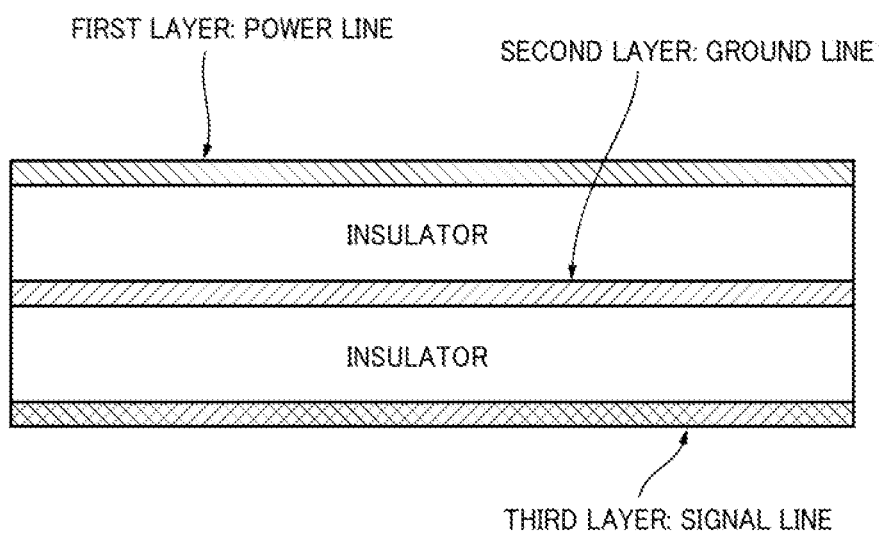
FIG. 7 is a longitudinal cross-sectional view illustrating a configuration of a laminated board assumed as a general configuration example for comparison with the present invention.

FIG. 6 is a time chart illustrating an example of a voltage waveform and a noise waveform.

The voltage waveform Vp illustrated in FIG. 6 corresponds to, for example, a waveform of periodic switching (switching of H/L) of the voltage in the power source 21 for causing the current i1 to flow through the power line of the laminated circuit board device 10 illustrated in FIG. 1. Therefore, the current i1 flows in a similar waveform in which the voltage waveform Vp and the timing are synchronized with each other. In addition, at the timing at which the H/L of the voltage waveform Vp is switched, a large change occurs in the current i1, thereby generating an induction magnetic field. In addition, each of the currents i2a, i2b in the laminated circuit board device 10 is a half of the current i1.

The voltage waveform Vs1 illustrated in FIG. 6 represents an example of a time series change of the signal voltage appearing in the signal system wiring pattern P2s formed in the second layer 10b of the laminated circuit board device 10 illustrated in FIG. 1. In addition, the voltage waveform Vs2 illustrated in FIG. 6 represents an example of a time series change of the signal voltage appearing in the signal system wiring pattern P2s formed in the second layer 10b in a situation in which the condition for realizing the present invention is not satisfied, for example, as in a case where there is no power line in the third layer 10c.

As illustrated in FIG. 6, in the voltage waveform Vs2, the noise waveform Wn generated in synchronization with the timing of switching the H/L of the voltage waveform Vp is superimposed as crosstalk. That is, the influence of the induction magnetic field generated by the change of the current i2a of the first layer 10a appears as the noise waveform Wn on the signal system wiring pattern P2s of the second layer 10b.

On the other hand, in the voltage waveform Vs1, the noise waveform Wn like the voltage waveform Vs2 does not appear. That is, since the influence of the induction magnetic field generated by the change of the current i2a of the first layer 10a and the influence of the induction magnetic field generated by the change of the current i2b of the third layer 10c cancel each other at the position of the second layer 10b located therebetween and become zero, the noise waveform Wn does not appear on the voltage waveform Vs1.

<Modified Example of Laminated Circuit Board Device>

In the example of the laminated circuit board device 10 illustrated in FIG. 1, it is assumed that the power source 21 is connected to the via 13 on one end side and the load 24 is connected to the via 14 on the other end side, and currents i1, i2a, i2b, and i3 flow in a direction from the via 13 side toward the via 14 side. However, in the in-vehicle system, both the power source 21 and the load 24 may be rechargeable batteries. In this case, the direction of the current may be switched in order to charge the battery of the power source 21, and the currents i1, i2a, i2b, and i3 may flow in the direction from the load 24 side toward the power source 21. Even when the currents i1, i2a, i2b, and i3 flow in the direction opposite to that of FIG. 1, when the directions of the currents i2a, i2b are aligned, the signal system wiring pattern P2s of the second layer 10b can be protected from the induction magnetic field of the electric power system wiring patterns P1p, P3p.

Incidentally, in the example of FIG. 1, it is assumed that the power source 21 and the load 24 are connected to the outside of the laminated circuit board device 10, but one or both of the power source 21 and the load 24 may be disposed on the same board as the laminated circuit board device 10.

Incidentally, in the examples illustrated in FIGS. 4A and 4B, the shape is defined such that the sum (LA1+LB1+LC1) of the pattern widths in the first layer 10a and the sum (LA3+LB3+LC3) of the pattern widths in the third layer 10c completely match. Even when the shapes do not completely match, it is possible to obtain the effect of reducing the noise waveform Wn generated in the signal system wiring pattern P2s.

Incidentally, although it is assumed that the laminated circuit board device 10 illustrated in FIG. 1 uses a three-layer conductive pattern included in a single multilayer board, a plurality of printed boards may be laminated in the thickness direction via a predetermined spacer. However, in the case of laminating a plurality of printed boards, it is assumed that there is a possibility of a positional deviation in a planar direction between a plurality of layers and a possibility of a deviation in a thickness width due to stress, and therefore, it is desirable to configure only a single multilayer board as illustrated in FIG. 1.

Incidentally, in the example of FIG. 1, the power line of the first layer 10a and the power line of the third layer 10c are connected by the vias 13, 14 in the board of the laminated circuit board device 10, but a circuit having the same function as that of the vias 13, 14 may be connected to the outside of the board.

<Advantages of Laminated Circuit Board Device 10>

In the laminated circuit board device 10 illustrated in FIGS. 1 to 3C, it is possible to prevent the noise waveform Wn from being superimposed on the signal system wiring pattern P2s on the second layer 10b located at the middle position of the first layer 10a and the third layer 10c due to the influence of the induction magnetic field from the electric power system wiring patterns P1p, P3p adjacent to the signal system wiring pattern P2s. In addition, since it is not necessary to prepare a layer of the ground pattern in order to shield noise from the power line, both the first layer 10a and the third layer 10c can be used for pattern disposition of the power lines. Therefore, even when the area occupied by the pattern of the power line is reduced, the resistance of the power line can be reduced by the use of the plurality of layers, and the power loss can be reduced. Therefore, it is easy to reduce the size of the laminated circuit board device 10.

In addition, the shapes of the electric power system wiring patterns P1p, P3p do not necessarily coincide with each other except for the portion facing the signal system wiring pattern P2s to be protected, and patterns of various shapes can be formed, for example, as illustrated in FIGS. 4A and 4B. By defining the shape such that the sum (LA1+LB1+LC1) of the pattern widths in the first layer 10a and the sum (LA3+LB3+LC3) of the pattern widths in the third layer 10c coincide with each other, the noise waveform Wn can be effectively reduced.

According to an embodiment, there is provided a laminated circuit board device in which circuit patterns of a first layer (10a), a second layer (10b), and a third layer (a third layer 10c) are formed on different surfaces parallel to each other by a foil-like conductor, the first layer, the second layer, and the third layer are separated by insulators (11, 12), and the second layer is disposed between the first layer and the third layer, the circuit pattern includes a circuit pattern of an electric power system for passing a current flowing between a predetermined power source (21) and a predetermined load (24), and a circuit pattern of a signal system through which a current smaller than that of the electric power system passes, the circuit pattern of the electric power system (power system wiring pattern P1p) and the circuit pattern of the signal system (signal system wiring pattern P1s) are disposed in the first layer, respectively, the circuit pattern of the signal system (signal system wiring pattern P2s) is disposed in the second layer, and the circuit pattern of the electric power system (electric power system wiring pattern P3p) is disposed in the third layer, the circuit pattern is formed such that shapes of a first circuit pattern belonging to the electric power system (electric power system wiring pattern P1p) of the first layer and a second circuit pattern belonging to the electric power system of the third layer (electric power system wiring pattern P1p) substantially coincide with each other, for a facing portion facing a protection portion of at least a part of the circuit pattern of the signal system in the second layer, the specification is defined such that the direction of the current (i2a) flowing through the first circuit pattern and the direction of the current (i2b) flowing through the second circuit pattern coincide with each other.

According to the laminated circuit board device configured as described above, even when a dedicated ground layer for noise shielding is not provided, it is possible to suppress the influence of the induction magnetic field generated with the current change of the power line in each circuit pattern of the first layer and the third layer on the signal line of the adjacent second layer. That is, since the signal line of the second layer to be protected from noise exists between the first layer and the third layer, the signal line of the second layer is affected by both the power line of the first layer and the power line of the third layer. However, with respect to the second layer, the first layer and the third layer exist in opposite directions to each other in the upper-lower direction with respect to the thickness direction of the board, and the current flow directions are aligned, and the magnitude of the induction magnetic field generated according to the magnitude of the current change is also the same. Therefore, the magnetic field due to the influence of the power line of the first layer and the magnetic field due to the influence of the power line of the third layer cancel each other out.

In the first circuit pattern (electric power system wiring pattern P1p), a pattern width in a direction (X-axis direction) orthogonal to the direction of the current flowing through the portion is formed to have a specific width, and in the second circuit pattern (electric power system wiring pattern P3p), a pattern width in a direction (X-axis direction) orthogonal to the direction of the current flowing through the portion may be formed to have the same specific width as the first circuit pattern (see FIGS. 3A and 3C).

According to the laminated circuit board device having the above configuration, since the pattern width in the first circuit pattern and the pattern width in the second circuit pattern are the same, the current distribution of the first circuit pattern and the current distribution of the second circuit pattern can be matched. Therefore, the magnitude of the induction magnetic field generated by the current change of the first circuit pattern and the magnitude of the induction magnetic field generated by the current change of the second circuit pattern can be equalized, and the influences of the induction magnetic fields of both are canceled out in the signal line of the second layer.

For each of the first circuit pattern and the second circuit pattern, a branching portion (branching/merging portion 32, 42) and a merging portion (branching/merging portions 34, 44) are formed between one end and the other end through which a current flows, and the shape may be defined such that a sum (LA1+LB1+LC1, LA3+LB3+LC3) of pattern widths of a plurality of current paths formed between the branching portions and the merging portions is the same in the first circuit pattern and the second circuit pattern.

According to the laminated circuit board device having the above configuration, a vacant space can be formed between the branching portions and the merging portions between the first circuit pattern and the second circuit pattern. Therefore, another circuit can be disposed in the vacant space, or the electronic component can be disposed. In addition, since the sum of the pattern widths is the same in the first circuit pattern and the second circuit pattern, the distribution of the current flowing in the first circuit pattern and the distribution of the current flowing in the second circuit pattern can be easily aligned. That is, the induction magnetic field generated by the current change of the first circuit pattern and the induction magnetic field generated by the current change of the second circuit pattern can be aligned.

One end of the first circuit pattern and one end of the second circuit pattern are configured to be connectable to a common power source (21) or a common load via a common circuit (via 13) one end side, and the other end of the first circuit pattern and the other end of the second circuit pattern may be configured to be connectable to a common load (24) or a common power source via a common circuit (via 14) on the other end side.

According to the laminated circuit board device having the above configuration, one end of the first circuit pattern and one end of the second circuit pattern can be connected to a common power source or a common load by the one end side common circuit. Further, the other end of the first circuit pattern and the other end of the second circuit pattern can be connected to a common load or a common power source by the other end side common circuit. Therefore, it is easy to supply a common current to the first circuit pattern and the second circuit pattern.

The first layer, the second layer, and the third layer are formed as independent layers having different positions in the thickness direction on a single printed circuit board, at least the circuit pattern of the first layer and the circuit pattern of the third layer may have a uniform thickness, and the circuit pattern of the first layer and the circuit pattern of the third layer may be formed of foil-like conductors having a common thickness (see FIG. 1).

According to the laminated circuit board device having the above configuration, since the circuit pattern of the first layer and the circuit pattern of the third layer are formed of conductors having a uniform and common thickness, it is possible to align the current distributions in both only by the pattern shape.

According to the laminated circuit board device of the present embodiment, it is possible to prevent the influence of the induction magnetic field generated with the current change of the power line on the signal line of another adjacent layer without providing a dedicated ground layer for noise shielding. Therefore, it is easy to reduce the resistance of the power line by effectively using the plurality of layers and to reduce the wiring pattern area of the power line.

What is claimed is:

1. A laminated circuit board device, comprising
a first layer, a second layer, and a third layer, wherein
the first layer and the second layer are separated by an first insulator, and the second layer and the third layer are separated by a second insulator, and the second layer is disposed between the first layer and the third layer,
patterns of the first layer, the second layer, and the third layer are formed on different surfaces parallel to each other by a foil-like conductor,
a first circuit pattern of an electric power system and a first circuit pattern of a signal system are disposed in the first layer, respectively, the first circuit pattern of the electric power system is configured to pass a current flowing between a predetermined power source and a predetermined load, and the first circuit pattern of the signal system is configured to pass a current smaller than the currently flowing through the of the power system,
a second circuit pattern of the signal system is disposed in the second layer, and
a second circuit pattern of the electric power system is disposed in the third layer,
shapes of the first circuit pattern of the electric power system of the first layer and the second circuit pattern of the electric power system of the third layer substantially coincide with each other, for portions of the first circuit pattern of the electrical power system and the second circuit pattern of the second circuit pattern facing a protection portion of at least a part of the second circuit pattern of the signal system in the second layer, and
the first circuit pattern of electric power system and the second circuit pattern of the electric power system are configured such that a direction of the current flowing through the first circuit pattern of the electric power system and a direction of the current flowing through the second circuit pattern of the electric power system coincide with each other.

2. The laminated circuit board device according to claim 1, wherein
in the first circuit pattern of the electric power system, a pattern width in a direction orthogonal to the direction of the current flowing through the portion is formed to be a specific width, and
in the second circuit pattern of the electric power system, a pattern width in a direction orthogonal to the direction of the current flowing through the portion is formed to have the same specific width as the first circuit pattern.

3. The laminated circuit board device according to claim 1, wherein
for each of the first circuit pattern of the electric power system and the second circuit pattern of the electric power system,
a branching portion and a merging portion are formed between one end and the other end through which a current flows, and
a shape is defined such that the sum of the pattern widths of a plurality of current paths formed between the branching portion and the merging portion is the same in the first circuit pattern of the electric power system and the second circuit pattern of the electric power system.

4. The laminated circuit board device according to claim 1, wherein
one end of the first circuit pattern of the electric power system and one end of the second circuit pattern of the electric power system are configured to be connectable to one of a common power source or a common load via a common circuit on one end side, and
the other end of the first circuit pattern of the electric power system and the other end of the second circuit pattern of the electric power system are configured to be connectable to another of the common load or the common power source via a common circuit on the other end side.

5. The laminated circuit board device according to claim 4, wherein the first circuit pattern of the electric power system is configured to pass a current of several amperes or more, and the first circuit pattern of the signal system is configured to pass a current of about several milliamperes.

6. The laminated circuit board device according to claim 1, wherein
the first layer, the second layer, and the third layer are formed as independent layers having different positions in the thickness direction on a single printed circuit board, and
at least the first circuit pattern of the electric power system of the first layer and the second circuit pattern of the power system of the third layer have a uniform thickness, and the first circuit pattern of the electric power system of the first layer and the second circuit pattern of the electric power system of the third layer are formed of foil-like conductors having a common thickness.

* * * * *